United States Patent [19]
Persson

[11] Patent Number: 4,677,522
[45] Date of Patent: Jun. 30, 1987

[54] ELECTRODE FOR MEASURING THE RELATIVE PERMITTIVITY OF A SUBSTANCE

[76] Inventor: Sture V. Persson, Stormstigen 26, 931 51 SkellefteÅ, Sweden

[21] Appl. No.: 838,935

[22] Filed: Mar. 12, 1986

[30] Foreign Application Priority Data

Mar. 14, 1985 [SE] Sweden ................................ 8501270

[51] Int. Cl.⁴ ........................ H01G 7/00; G01F 23/00
[52] U.S. Cl. .................................... 361/280; 73/304 C
[58] Field of Search ............... 361/280, 282; 73/304 C

[56] References Cited

U.S. PATENT DOCUMENTS

| | | | |
|---|---|---|---|
| 2,868,015 | 1/1959 | Haropulos | 73/304 C |
| 3,283,577 | 11/1966 | Schuck | 73/304 C |
| 3,343,415 | 9/1967 | Johnston | 73/304 C |

Primary Examiner—Donald A. Griffin
Attorney, Agent, or Firm—Cushman, Darby & Cushman

[57] ABSTRACT

An electrode (10) intended for measurement of relative permittivity. Each one of the electrically conductive electrode elements of the electrode (12) of an even number, e.g. n, there being electrodes includes a corresponding line wire (20 and 22, respectively) for connection to a measuring bridge or the like. The electrode elements (12) are mutually separated by means of spacer means (18) of electrically insulating material. The lead-in wires (20,22) of adjacent electrode elements (12) can be connected in pairs for measurement. The electrode elements (12) are arranged on an electrode body (14) shape like to a rod and of an electrically insulating material. The electrode elements (12) are tubular and are arranged in recesses (16) with adapted measures in the electrode body. The spacer means (18) comprise of annular members intergral with the electrode body (14).

9 Claims, 2 Drawing Figures

ELECTRODE FOR MEASURING THE RELATIVE PERMITTIVITY OF A SUBSTANCE

BACKGROUND OF THE INVENTION

This invention relates to an electrode intended for measurement of relative permittivity. In a known manner each one of the electrically conductive electrode elements of the electrode is provided with a corresponding lead-in wire for connection to a measuring bridge or the like.

As is well-known, the permittivity or dielectric constant indicates the penetrating ability of the field forces in different media and signifies the ratio between quantity of charges and potential difference multiplied by the thickness of the respective medium.

When measuring the relative permittivity $\epsilon_r$ liquids or solids plane-parallel or cylindrical electrodes such as according to ASTM D 150 are normally used.

SUMMARY OF THE INVENTION

However, as will appear below, it may be desired in certain connections to use electrodes of another geometrical design. Such an alternative design is enabled according to the invention in that the electrode comprises n coaxially arranged electrode elements, which are separated by spacer means of electrically insulating material, the lead-in wires of adjacent electrode elements being connectable in pairs for measurement. The electrode elements are preferably arranged on a cylindrical electrode body. The electrode elements are annular and placed in recesses with adapted measures in the electrode body, said spacer means comprising of annular members integral with the electrode body.

The advantages of an electrode formed according to the principles of the invention in comparison with a plane-parallel or cylindrical electrode are as follows:

(i) At measurements in media considerably changing state of aggregate in curing, e.g. curing of plastics (epoxy), vulcanization of rubber etc., the new electrode can be taken out of the respective medium without trouble without being destroyed. This is made possible thanks to the fact that the electrode surface of the new electrode can be made very flat, the risk of adhesion between electrode and medium being excluded almost completely;

(ii) Due to its favorable geometrical design, the electrode can be subjected to high pressures without changing the geometry thereof and without destroying the same. This is of special importance at measurement of substances having a very high viscosity such as polymer melts or rubber;

(iii) The electrode can be built with more than two electrode elements. Thus, n electrode elements can be arranged coaxially, the lead-in wires of adjacent electrode elements being connected in pairs for measurement. A device with such multielement eletrode adjacent pairs of electrode elements can then be automatically connected. In this way it will be possible to calculate the movement of the curing gradient from the surface of a medium towards its centre. The multielement electrode has its most important application at measurement in media showing permittivity gradients as the result of curing or vulcanization reactions.

BRIEF DESCRIPTION OF THE DRAWINGS

What is novel in the electrode intended for measurement of relative capacitance will now be described in greater detail below in the form of a preferred illustrative example with reference to the appended drawing.

DETAILED DESCRIPTION OF THE PRESENTLY PREFERRED EMBODIMENT

Figure 1:
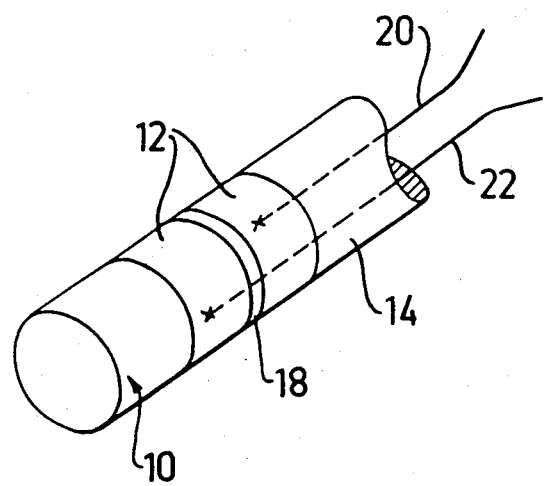
FIG. 1 is a perspective view of the preferred embodiment of a part of the new measuring electrode.
Figure 2:
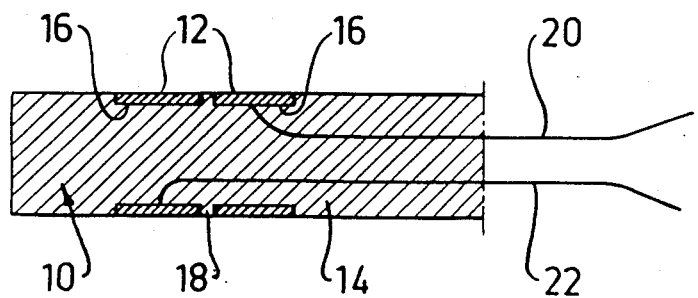
FIG. 2 shows the preferred embodiment of the new measuring electrode in axial section.

In the embodiment of the new measuring electrode 10 indicated on the drawing, only two similar electrode elements 12 are illustrated but the number can of course be selected as desired and must always be even as consecutive electrode elements 12 are intended to be connected in pairs for measurement.

As is apparent from the drawing the new measuring electrode 10 also comprises a homogeneous, rod-shaped electrode body 14 of electrically insulating material such as polytetrafluoroethylene (PTFE). The electrode elements 12 made of metal are tubular and are placed in corresponding recesses 16 in the electrode body 14. It is important that the recesses 16 have a depth well corresponding to the thickness of the electrode elements 12 so that an almost quite flat outer surface of the electrode 10 is obtained. Between the two tubular electrode elements 12 there is a spacer means 18 which comprises in this case the material of the very electrode body 14 remaining between the recesses 16. One end of a line wire 20 and 22, respectively, is connected to the corresponding electrode element 12. The opposite end of the line wire 20 and 22, respectively, is connectable to a measuring bridge or the like not shown on the drawing, connection being possible e.g. by means of a step switch turned by a motor. When n electrode elements 12 are used it will thus be possible to successively detect motion of the curing gradient, as has already been mentioned before. As an alternative, the measuring apparatus can of course also be connected to a microprocessor.

The measuring principle of the new measuring electrode 10 is based on the fact that an outer edge and verge capacitance—often called stray capacitance—arises between the outer generatrix surfaces of the electrode elements 12 arranged in pairs. As the relative permittivity is included in the expression of the outer edge capacitance the outer stray field can thus be utilized to measure the changes in capacitance arising when the medium surrounding the measuring electrode 10 has a relatively permittivity value, which is greater than 1.

Modifications of the measuring electrode 10 described above can of course be made within the scope of the invention. Thus, the form of the squarely cut electrode end in the drawing can be changed. Further, the form of the electrode elements can also be changed both at the ends thereof and, in respect of the surrounding portion, with regard to the electrode body.

What I claim is:

1. Electrode apparatus for detecting the relative permittivity of a substance, comprising:
   an electrode body having a cylindrical shape and defining an outside cylindrical surface, said body having a plurality of annular grooves disposed in said surface to define a plurality of electrically insulated rings each having an outer surface substantially on said cylindrical surface;
   an even number of electrode elements each one disposed in a respective one of said annular grooves and having an exterior surface substantially on said cylindrical surface and disposed to contact said substance, each electrode element having a lead wine adapted to be coupled to a measuring device, the lead wires being disposed in pairs to cause stray capacitors between pairs of adjacent electrodes to detect said relative permittivity.

2. The apparatus of claim 1, wherein said electrode body comprises an electrically insulating material.

3. The apparatus of claim 2, wherein said electrode body consists of said electrically insulating material.

4. The apparatus of claim 1, wherein each of said electrode elements is tubular in shape.

5. The apparatus of claim 1, wherein said even number is 2.

6. Apparatus according to claim 1 wherein said electrically insulated rings are integral with said electrode body, and wherein said electrode body comprises an electrically insulating material.

7. Apparatus according to claim 1 wherein said electrode body comprises a homogeneous body comprising polytetrafluoroethylene.

8. Apparatus according to claim 1 wherein each said electrode element comprises an electrically conductive material.

9. Apparatus according to claim 1 wherein each said annular groove has a depth, and wherein each said electrode element has a wid substantially equal to said annular groove depth.

* * * * *